United States Patent [19]

Wihl et al.

[11] Patent Number: 4,532,650
[45] Date of Patent: Jul. 30, 1985

[54] PHOTOMASK INSPECTION APPARATUS AND METHOD USING CORNER COMPARATOR DEFECT DETECTION ALGORITHM

[75] Inventors: Tim S. Wihl; Mark J. Wihl, both of San Jose, Calif.

[73] Assignee: KLA Instruments Corporation, Santa Clara, Calif.

[21] Appl. No.: 494,762

[22] Filed: May 12, 1983

[51] Int. Cl.³ .............................................. G06K 9/00
[52] U.S. Cl. ...................................... 382/8; 356/237; 358/101; 358/106
[58] Field of Search ...................... 382/1, 8, 16, 28, 41, 382/57; 358/106, 107, 101; 356/237; 250/562–563, 572; 364/507, 489

[56] References Cited

U.S. PATENT DOCUMENTS

| | | | |
|---|---|---|---|
| 4,148,065 | 4/1979 | Nakagawa et al. | 358/106 |
| 4,282,510 | 8/1981 | Southgate | 358/106 |
| 4,282,511 | 8/1981 | Southgate et al. | 358/106 |
| 4,403,294 | 9/1983 | Hamada et al. | 358/106 |
| 4,454,542 | 6/1984 | Miyazawa | 358/106 |
| 4,472,738 | 9/1984 | Hada et al. | 358/101 |

Primary Examiner—Leo H. Boudreau
Attorney, Agent, or Firm—Claude A. S. Hamrick

[57] ABSTRACT

Defect detection apparatus including a mechanical and optical system for scanning duplicate areas of a photomask to be inspected, electronic means for converting the optically scanned information to digitized form, memory for storing such information, and means for comparing information obtained from one inspected area to the other inspected area to determine differences therebetween, such differences being classified as defects. The detection is accomplished using a vector gradient within a matrix technique to develop candidate and cancellor information which is then logically manipulated to qualify the data obtained from each pixel matrix and then, after qualification, is used to determine whether or not a defect has been detected. The subject invention has particular application to the detection of defects occurring at pattern corners within the inspected photomask and is specifically directed to overcoming difficulties previously encountered in detecting such defects.

25 Claims, 10 Drawing Figures

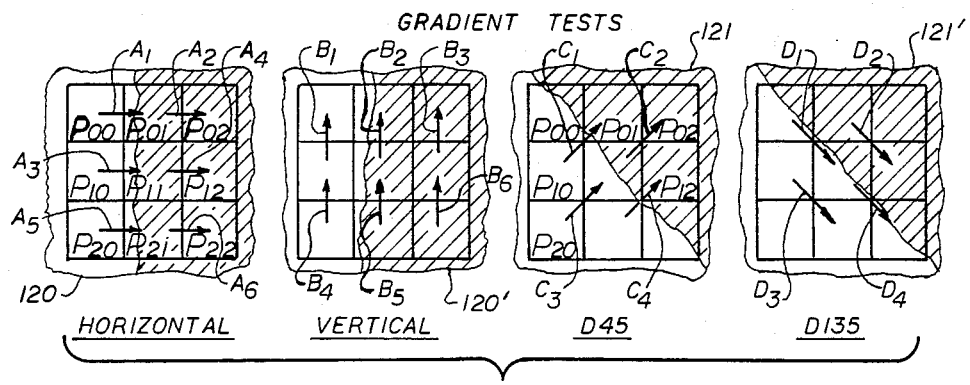
FIG 4
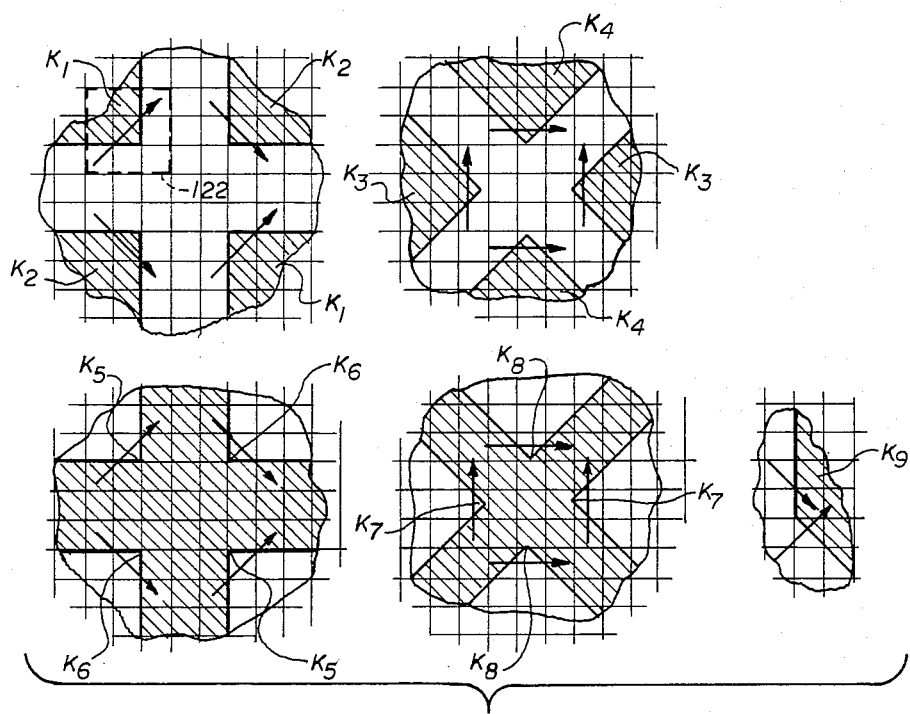
FIG. 5
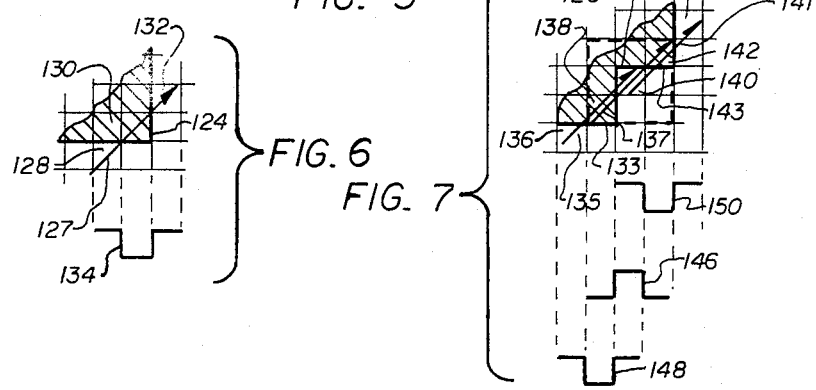
FIG. 6
FIG. 7

PHOTOMASK INSPECTION APPARATUS AND METHOD USING CORNER COMPARATOR DEFECT DETECTION ALGORITHM

BACKGROUND OF THE INVENTION

1. Field of the Invention

The present invention relates generally to object inspection apparatus and more particularly to an apparatus and method for inspecting photomasks having duplicate die patterns thereupon for defects by utilizing an edge and corner comparison defect detection technique to identify defects as differences between otherwise duplicate die patterns. Alternatively, die patterns may be compared to corresponding data taken from a data base.

This application is related to the co-pending application of Kenneth Levy, Steven L. Bucholz, William H. Broadbent and Mark J. Wihl entitled "Photomask Inspection Apparatus and Method with Improved Defect Detection", Ser. No. 492,658, filed May 8, 1983 and the application of Don L. Danielson, Mark J. Wihl and David A. Joseph, entitled "Reticle Inspection System", Ser. No. 474,461, filed Mar. 11, 1983, both of which are assigned to the assignee of the present application. The disclosures of both applications are expressly incorporated herein by reference.

2. Description of the Prior Art

Automatic photomask inspection systems have been commerically available for several years now, and examples of such systems may be found in the U.S. Patents to K. Levy and P. Sandland, No. 4,247,203, entitled "Automatic Photomask Inspection System and Apparatus" and No. 4,347,001, also entitled "Automatic Photomask Inspection System and Apparatus". The devices disclosed in these patents optically project images of two die patterns onto arrays of photosensors which are scanned periodically as the photomask is moved relative thereto. The scanned or sampled images are then digitized to form two dimensional pixel representations of the die pattern which are stored in digital form and processed by defect detection circuitry to locate and identify defects. Defect detection is normally accomplished by comparing the digitized images of two similar die patterns and noting any differences between the two; such differences being identified as defects.

A significant problem inherent in most prior art inspection systems is that the efficiency of the defect detection circuitry is relatively poor for defects located near corners. In order to overcome such problems, some kind of template matching technique is usually employed. However, in using such techniques, there are almost always cases involving unusual quantization in which errors occuring at or near image corners are missed.

SUMMARY OF THE PRESENT INVENTION

It is therefore an object of the present invention to provide an approved apparatus for inspecting photomasks and the like using an improved edge and corner defect detection apparatus and method.

Another object of the present invention is to provide an improved apparatus and method for quickly and efficiently detecting defects in duplicate die patterns of a photomask by aligning and comparing pixel representations of the die patterns in real time.

A further object of the present invention is to provide an electronic circuit for defect detection that concurrently processes pixel representations of die patterns using vector gradients within a matrix to detect edges and corners.

Still another object of the present invention is to provide a corner comparator defect detection apparatus and method having improved defect detection efficiency by reducing undetected and falsely detected defects.

Still another object of the present invention is to provide a defect detection apparatus and method that permits misalignment of plus or minus two pixels between pixel representations of duplicate die patterns without missing defects occuring near corners or producing false detections related thereto.

An additional objective of the present invention is to provide a defect detection apparatus and method using a corner comparison algorithm to maximize detection sensitivity to defects occuring at or near corners appearing in an image pattern.

Briefly, a preferred embodiment of the present invention includes a mechanical and optical system for scannning duplicate areas of a photomask to be inspected, electronic means for converting the optically scanned information to digitized form, means for storing such information, and means for comparing information obtained from one inspected area to the other inspected area to determine differences therebetween, such differences being classified as defects. In accordance with the present invention, the detection is accomplished using a vector gradient within a matrix technique to develop candidate and cancellor information which is then logically manipulated to qualify the data obtained from each pixel matrix and then after qualification, is used to determine whether or not a defect has been detected. The subject invention has particular application to the detection of defects occuring at pattern corners within the inspected photomask and is specifically directed to overcoming difficulties previously encountered in detecting such defects.

Among the advantages of the present invention is that it dynamically detects errors occuring at or near corners even though the pixel representations used to effect the comparison may not be precisely aligned.

Another advantage of the present invention is that the defect detection circuit is particularly sensitive to defects occuring at or near pattern corners.

These and other objects and advantages of the present invention will no doubt become apparent to those skilled in the art after having read the following detailed description of the preferred embodiment illustrated in the several figures of the drawing.

IN THE DRAWING

FIGS. 4 and 4a are pixel matrix diagrams illustrating the gradient tests performed in accordance with the present invention;

FIG. 5 is an illustration depicting nine corner configurations detectable in accordance with the present invention;

FIGS. 6 and 7 are diagrams schematically illustrating a corner identification technique in accordance with the present invention;

DETAILED DESCRIPTION OF THE PREFERRED EMBODIMENT

Figure 1:
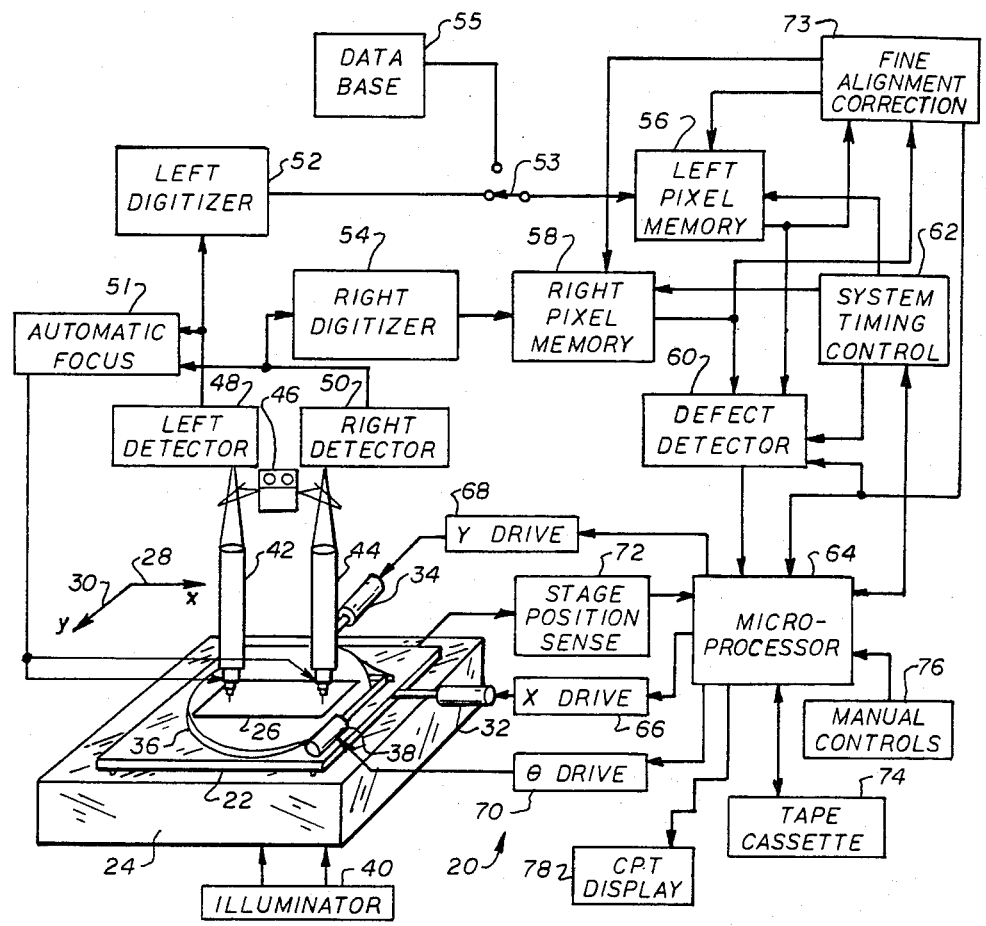
FIG. 1 is a functional block diagram showing a photomask inspection apparatus in accordance with the present invention for scanning, detecting and recording defects occuring in the patterns of a photomask.

Referring now to FIG. 1 of the drawing, a preferred embodiment of a photomask inspection system according to the present invention is schematically illustrated in general at 20. The system includes an air-bearing stage 22 mounted on a granite table 24 for transporting and positioning a photomask 26 to be inspected. Stage 22 is movable in the X and Y directions (indicated by the arrows 28 and 30) by motors that are schematically illustrated at 32 and 34, respectively. A photomask holder 36 is rotatable in the XY plane by a motor 38 to allow the photomask to be aligned with the X and Y reference directions.

Figure 2:
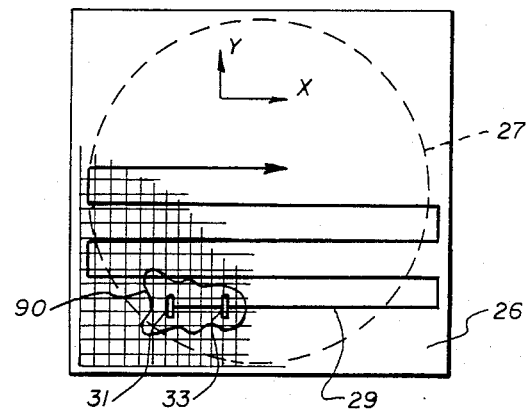
FIG. 2 is a schematic showing in plan view of a photomask illustrating the simultaneous scanning of a pair of duplicate die patterns in accordance with the present invention.

As illustrated in FIG. 2, the photomask 26 which will later be used to produce semi-conductor chip devices, typically on a circular wafer such as is illustrated at 27, is scanned in a raster pattern, as illustrated by the lines 29, with two accurately spaced viewing areas 31 and 33 being inspected simultaneously. Inspection for defects is accomplished by comparing pixel representations obtained from viewing areas 31 and 33 containing duplicate die patterns, and defects are identified at those locations in which the two pixel representations do not match.

Pixel representations are formed by a combination of optical and electronic means, the former including an illuminator 40 (FIG. 1) disposed beneath the granite table 24 and which illuminates the bottom of the photomask through an opening in table 24. Also included are left and right optical inspection systems 42 and 44, respectively, which project images of light transmitted through the transparent portions of the photomask onto a binocular viewhead 46 and onto left and right detectors 48 and 50, respectively. The binocular viewhead permits viewing of a magnified image of the photomask by an operator.

The task of focusing images of the photomask onto the left and right detectors is performed by an automatic focus circuit 51 which responds to output signals generated by the detectors 48 and 50. The left and right inspection optic systems 42 and 44 are positioned relative to each other so as to focus identical portions (areas 31 and 33 in FIG. 2) of two die patterns of photomask 56 onto the respective left and right detectors.

The electronic means for forming pixel representations of the die patterns includes the detectors 48 and 50 which generate analog voltage signals that are proportioned to the intensity of light impinging there upon, and left and right digitizers 52 and 54 which convert the analog voltage signals generated by the detectors into digital signals. The digital signals are then stored temporarily in left and right pixel alignment memorys 56 and 58, respectively. Alternatively, the data input to the left pixel memory could be taken via a switch 53 from a data base 55 which contains an electronically stored and known correct replica of the photomask being inspected. An example of the use of a data base in a related system is disclosed in the above-identified copending U.S. patent application of Danielson, Wihl and Joseph, entitled "Reticle Inspection System."

Due to the enormous amount of memory that would otherwise be required to store a complete pixel representation of the photomask 26, the inspection operation is continuously performed as the pixel representations are formed. Memories 56 and 58 are first-in-first-out (FIFO) type memory circuits that at any one point in time contain only a small fraction of the total pixel representations of the die patterns. In the preferred embodiment, left and right memories 56 and 58 respectively contain pixel data corresponding to a predetermined number of the most recent scans of left and right detectors 48 and 50. In the present embodiment, the seven most recent sets of scan data are retained.

Portions of the digital data stored in the left and right memories are compared to each other in a predetermined manner by defect detection circuitry included within the detector 60 to locate defects in the die patterns of the photomask. The speed of operation of the defect detector determines the throughput of the inspection apparatus 20 and thus the productivity of the operation. The portion of the detector 60 forming the present invention will be described below in much greater detail.

A system timing control circuit 62 provides timing signals to coordinate the sequences of the inspection process. Timing signals and defect results are respectively input to a micro-processor 64 for subsequent use and processing.

Processor 64 controls the position and movement of the air-bearing stage 22 through X, Y and $\theta$ drives 66, 68 and 70, respectively, in response to program instruction and data received from the stage position sensor 70. In addition, a fine alignment correction circuit 73, which responds to data contained in memories 56 and 58, effects fine adjustments of left and right pixel data so that they are aligned to within plus or minus two pixels. Drives 66, 68 and 70 are preferably motor controllers and sensor 72 is preferably an optical encoder.

Inspection parameters may be prerecorded and input to micro-processor 64 via a tape cassette 74, a floppy disk drive or other means, or may be input manually through manual controls 76. Instructions to the operator for visual display of the photomask may be displayed on a CRT display 78. Defect data resulting from the inspection operation is output to a tape cassette 74 or other storage medium. The design and operation of those features of the inspection apparatus 20 which are necessary for the formation of the pixel representations of the die pattern are described in the above-identified Levy and Sandland patents which are hereby incorporated by reference.

While the automatic focus circuit 52 maintains focused images of the areas 31 and 33 of photomask 26 on the left and right detectors 48 and 50, the micro-processor 64 directs the X and Y drives 66 and 68 to move the stage 22 in a serpentine path such as that illustrated at 29 in FIG. 2 so that the entire photomask area to be inspected is sequentially viewed by the detectors. The inspection operation occurs during translations in the X direction when the stage 22 is moving at a constant velocity. Between X translations, the stage is indexed in the Y direction to reposition it for the next X translation. As a matter of convenience, features on the photomask that are parallel to the X direction are hereinafter referred to as horizontal, and features that are parallel to the Y direction are hereinafter referred to as vertical.

The image sensing elements of detectors 48 and 50 are preferably photosensors that are responsive to the intensity of light thereupon. The respective photosensors, typically 420 in number, are arrayed at equally spaced positions along the Y or vertical direction, and the size of the area (pixel) of the photomask to which each photosensor responds is a function of the magnification of the inspection optics 42 and 44 as well as the size of the photosensors. At any one time the photosensors of the left or right detector view an area of the photomask that is one unit wide in both the X and Y directions. By moving the stage 22 in the X direction at a constant velocity and by periodically scanning the analog output signals of the photosensors, the two dimensional pixel representation of the photomask is obtained.

If the photomask 26 and the inspection optics 42 and 44 are precisely aligned, then all photosensors on the left detector 48 and all photosensors on the right detector 50 will sense corresponding areas of duplicate die patterns. If there is a misalignment in the Y direction, the effective result is that corresponding areas will be sensed but by photosensors that are displaced in Y from the equivalently positioned photosensors.

A pixel is the rectangularly shaped element of which the pixel representations are composed. Each pixel corresponds to a small rectangular area of the photomask. As indicated above, the Y dimension of each pixel is determined by the photosensor spacing and the optical magnification, while the X dimension is determined by the stage velocity in X and the frequency of scanning of the outputs of the photosensors. Each pixel has an X and Y address corresponding to the X and Y coordinate location of the small rectangular area of the photomask that is viewed by its photosensor during the point in time when the photosensor is scanned.

The digitized sensor outputs for each scan are stored temporarily in the left and right pixel memories 56 and 58 to form the pixel representations of the die patterns. Each scan of the photosensors of each detector defines one vertical column of pixel representations and each pixel is assigned a binary value that is proportional to the intensity of light instant upon its photosensor during the point in time when the photosensor output is scanned.

In the preferred embodiment, the analog output signals of the photosensors are digitized by digitizers 48 and 50 to one of four binary values, i.e., 11 (white), 10 (white-gray), 01 (black-gray), and 00 (black). White indicates that the photomask area imaged on the photosensor is transparent thereby allowing the full intensity of illuminating light to impinge on the photosensor. Black indicates that an opaque area of the pattern completely blocks the illuminating light from reaching the photosensor. White-gray and black-gray indicate the presence of both transparent and opaque pattern portions within the pixel area imaged on the photosensor as caused by the presence of one or more pattern edges or corners. A white-gray pixel value indicates that the photomask area that is imaged on the photosensor contains more transparent area than opaque area while a black-gray pixel value indicates more opaque area than transparent area in the photomask area imaged on the photosensor.

Figure 3:
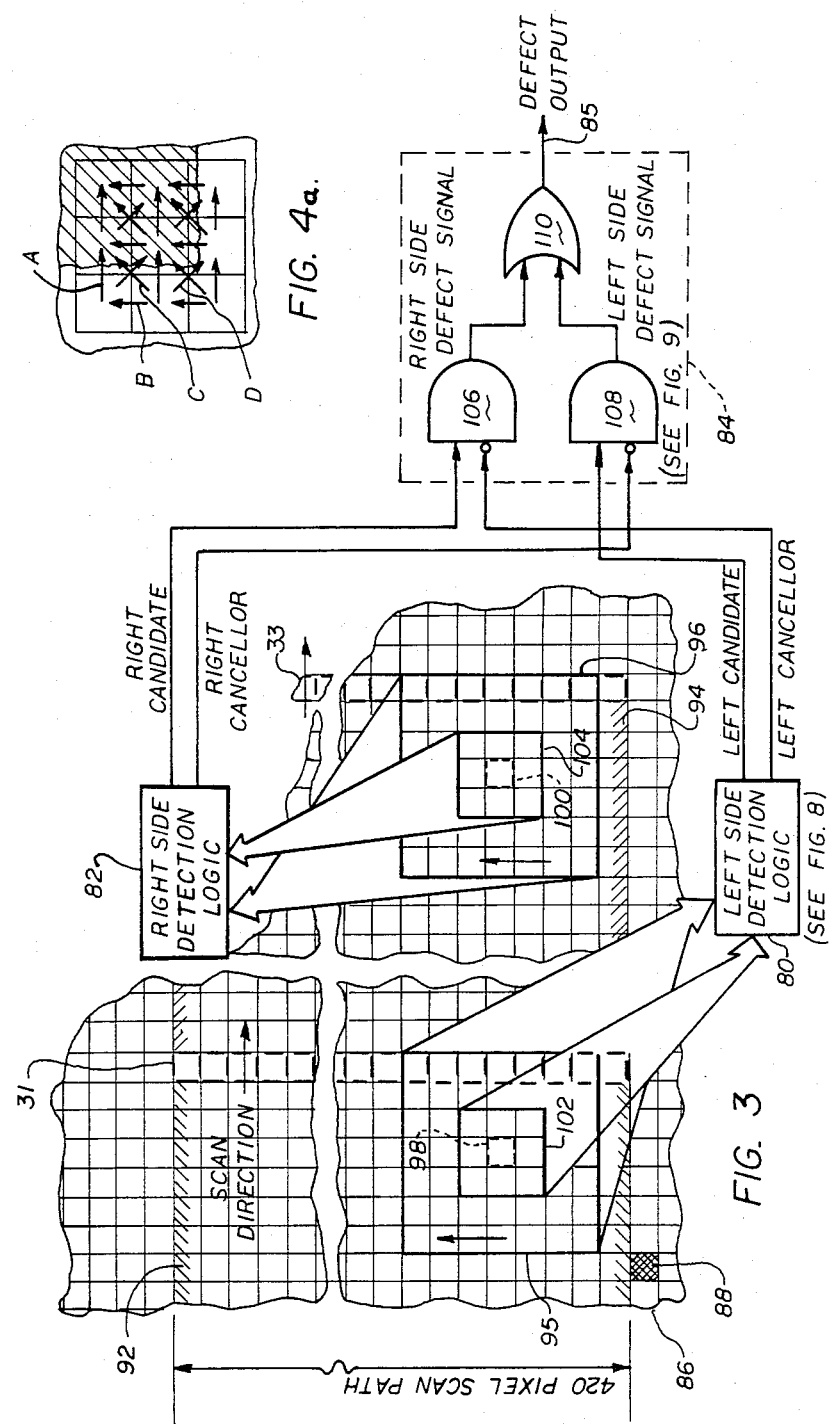
FIG. 3 is a diagram conceptually illustrating operation of the present invention.

In accordance with the present invention, certain detection logic is included within defect detector 60 which is generally illustrated in FIG. 3. Such logic may be generally described as including left side detection logic 80, right side detection logic 82 and combinational logic 84. In order to generally explain operation of such logic, an array 86 of descrete pixels 88 is depicted corresponding to the region 90 of photomask 26 shown in FIG. 2. Also depicted are the pixel locations of the left detector array shown at 31 and the right detector array shown at 33. Note that as illustrated, the detectors 31 and 33 include linear arrays of 420 photosensitive detectors that correspond to 420 pixels on the left side scan and 420 pixels on the right side scan. The effective scan path on the left side is illustrated by the shading 92, while the scan path on the right side is illustrated by the shading 94. Also depicted in FIG. 3 are a pair of $7 \times 7$ matrix arrays shown at 95 and 96 which respectively represent "viewing windows" of pixels that move vertically with respect to the horizontal detector scan directions. For each horizontal position of the detectors 31 and 33, the matrix windows 95 and 96 will be stepped vertically 420 times so that each pixel in the scan path is viewed through the center pixel portions 98 and 100 of the matrices 95 and 96, respectively. In other words, for each scan clock there are 420 pixel clocks.

As will be further explained below, during each pixel clock, two bits of pixel data is obtained for each of the nine pixels in the $3 \times 3$ center matrix (sub-matrix) 102 while two bits of data from each pixel in the $7 \times 7$ total matrix 95 are obtained, and all such information is input to the left side detection logic 80. Similarly, during each pixel clock, corresponding data is obtained from each pixel of $3 \times 3$ center matrix 104 as well as from $7 \times 7$ matrix 96 and such information is fed into the right side detection logic 82.

In response to such input data, each detection logic unit will generate candidate and cancellor signals which are input to the combinational logic unit 84. Generally speaking, logic unit 84 includes AND logic circuitry 106 for receiving the right candidate information and the inverted left cancellor information and AND logic circuitry 108 for receiving left candidate information and inverted right cancellor information. The outputs of the AND logic circuitry 106 and 108 produce right and left defect signals respectively. The two outputs are then ORed in OR gate circuity 110, the output of which provides a single defect output signal at 85. It will be appreciated that in the illustrated example there is a possibility of 420 defect outputs capable of being generated at 85 for each scan increment of the detectors 31 and 33.

In the present invention, gradient information relative to both the $7 \times 7$ matrices and the $3 \times 3$ matrices is obtained by the system logic. In FIG. 4 of the drawing, the four gradient tests performed for the $3 \times 3$ matrices are diagramically illustrated. More particularly, horizontal, vertical, diagonal 45° (from vertical) and diagonal 135° (from vertical) tests are performed by taking the vector differences between the digital pixel values of each pixel and an adjacent pixel. In the case of the horizontal test illustrated at 120, such differences are represented by the arrows A; e.g., arrow A represents that horizontal vector difference between the binary values of pixel P00 and P01. The absolute values of the differences corresponding to the six arrows A1 through A6 are then summed over the $3 \times 3$ matrix to provide a gradient measurement value indicative of the nature of the information contained within the pixels of the matrix. For example, in the horizontal case shown at 120, it will be appreciated that if a white pixel has a binary value of 11; a mostly white pixel has a binary value of 10; a mostly black pixel has a binary value of 01; and a black pixel has a binary value of 00, then the pixels illustrated would have the following binary values:

| | |
|---|---|
| P00 = 11 = 3 | P01 = 01 = 1 |
| P02 = 00 = 0 | P10 = 11 = 3 |
| P11 = 01 = 1 | P12 = 00 = 0 |
| P20 = 11 = 3 | P21 = 01 = 1 |
| P22 = 00 = 0 | |

Accordingly, A1, A3, and A5 will be equal to an absolute value of 2, i.e., (3-1) while A2, A4, and A6 will be equal to an absolute value of 1, i.e., (1-0). Summing the absolute values of A1 through A6, a relatively strong horizontal gradient of 9 will be obtained. If now, the vertical test is applied to the same matrix as indicated at 120', it will be seen that the absolute values of each vector B1 through B6 will be equal to zero, a relatively weak vertical gradient, thus indicating in the presence of a vertical edge. Similarly, a diagonal 45° (D45) test shown at 121, in which the absolute values of the binary diffferences between the diagonally adjacent pixels P10 & P01, P11 & P02, P20 & P11 and P21 & P12 are obtained and summed together to provide a D45 gradient value, will indicate a strong D45 gradient for the illustrated diagonal edge. On the other hand, a diagonal 135° test performed on the same diagonal edge will obtain difference vectors D1 through D4, the sum of the absolute values of which will be weak, thus indicating a 135° diagonal edge. It will thus be apparent that if an edge passes through the 3×3 matrix, one of the horizontal/-vertical gradient or one of the D45/D135 gradients will be strong and the other weak, thus indicating the existence of an edge. However, for either illustrated case, at least one of the gradients will be equal to zero. This of course presumes that all permissible edge geometries are near horizontal or near vertical or near 45° or near 135°. But if a corner appears within the 3×3 matrix, it will be apparent from FIG. 4a that when the above-stated four tests are performed, no test will produce a zero gradient. Accordingly, the non-occurence of a zero gradient will evidence the presence of a corner within the matrix. However, the type of corner present will not be evident. Thus, an additional test is required to identify the type of corner detected.

There are nine types of corners that can be expected to occur and such corners are illustrated in FIG. 5 by the segments K1 through K9. The right angled corners K1 through K4 have sides oriented orthogonally relative to the pixel grid, while the corners K5 through K8 are right angled but their side edges extend in non-orthogonal directions relative to the pixel grid. The corner represented by K9 is and obtuse corner which is a special case as will be described below. With regard to the corners K1 thrugh K8, it will be noted that a 3×3 matrix haing its center pixel including the corner, such as particularly illustrated at 122, has a unique characteristic; namely, no matter what the orientation of the corner, at least one of the horizontal, vertical, D45 or D135 vectors through these adjacent pixels will cross the corner and will experience logic level changes in opposite directions. See for example, in FIG. 6, the vector 127 passing through the pixels 128, 130 and 132 and crossing the corner 124. Note that the pixel logic along the D45 vector changes from high to low to high. Similarly, note in FIG. 7 that the vector 137 passing through the interior corner 126 (and pixels 138, 140 and 142) transitions from low to high to low as illustrated at 146. From the preceding discussion, it can be anticipated that by carrying out the three-pixel vector or toggle test in the horizontal, vertical, D45 and D135 directions, the presence of a corner suggested by a non-zero 3×3 matrix test can be identified by a three pixel vector test. Accordingly, this test involves the noting of at least two contra level changes, a toggle, in any one direction. As illustrated, for example in FIG. 6, the testing of the three pixels 128, 130 and 132 shows two level changes (at 134). Since the level changes are from white to black to white, such change is designated as a valley or V-type corner. In FIG. 7 the vector 137 passing through pixel 140 indicates a change from black to white to black. The level change is illustrated at 146 and is designated a hill or H-type corner. Note, however, that for three pixel vector passing through pixels 138 and 142, the tests will indicate valleys as illustrated at 148 and 150, respectively.

As suggested above, the present invention uses gradient and toggle information in making all of its determinations as to where an edge lies or where a corner lies. In order to obtain such information, 3×3 matrices and 7×7 matrices, both centered on the same pixel are utilized. The 3×3 matrix, as illustrated above in FIGS. 3 and 4, contains nine pixels, each represented by data stored in the form of a two bit binary value corresponding to four levels of data. It is therefore implicit throughout this description of a particular embodiment that any pixel will have a numerical value of 0, 1, 2 or 3, and for any 3×3 matrix, four sets of gradient information can be obtained. For the vertical and horizontal cases, 6 differences are obtained, while for the D45 and D135 cases only four differences are obtained.

The vertical gradient information, for example, is obtained by taking the absolute value of the differences between each vertically adjacent pixel and summing all such values. The resulting sum of the six differences will be a five bit binary number representing the vertical gradient. In looking again at the case illustrated in FIG. 4 where a vertical edge passes through the 3×3 matrix, it is apparent that there will be a strong horizontal gradient. On the other hand, in taking the vertical gradient test, it is apparent that all differences are between white and white, gray and gray or black and black and thus a zero value of gradient is obtained. Accordingly, a strong horizontal gradient and a weak vertical gradient clearly indicate the presence of a vertical edge. In the D45 and D135 tests, only four pixel differences are involved in each test. Therefore only four bits of binary data are used to indicate the gradient.

From these diagrams, it will be apparent that a numerically strong horizontal gradient and a numerically weak vertical gradient will evidence a vertical edge whereas a numerically weak horizontal gradient and a numerically strong vertical gradient will evidence a horizontal edge. Similarly, a numerically strong D45 gradient and a numerically weak D135 gradient will evidence a 135° edge while a numerically weak D45 gradient and a numerically strong D135 gradient will evidence a 45° edge. However, if a corner appears within the 3×3 matrix and the corner is either within or very near the center pixel, each of the four gradient tests will have a non-zero value exceeding a particular threshold. Accordingly, the presence of a corner can be indicated by the fact that all four of the tests indicate gradients above a certain minimum threshold.

For instance, if a straight line is considered, there is always going to be a direction parallel to that line which will have a low gradient. The other gradients will be strong to moderate but the one parallel to the edge will be weak. However, if the edge is not a straight edge but has a point of inflection somewhere along it, there will be no gradient weaker than a certain weakness threshhold. The basic corner test is therefore accomplished by simply determining that all four of the gradients are above the minimum threshhold.

It will thus be apparent that using the four gradient test either a straight edge or the presence of a corner is suggested. However, as indicated above, the nature of the corner is not apparent. Accordingly, the toggle test must be performed with the toggle being defined as either an increase followed by a decrease in intensity across three adjacent pixels in either a horizontal, vertical or one of the diagonal directions, or a decrease followed by an increase along any of the four vectors. Since applications in which the invention is intended for use have a minimum geometry size of no less than two pixels, there is never a case on good geometry that three adjacent pixels in any direction will show an increase in intensity followed by a decrease, or a decrease in intensity followed by an increase, unless the 3×3 matrix is directly across a corner. Accordingly, if at least one of the sets of three adjacent pixels shows a non-zero second derivative, then there must be a corner present, and by determining which one of the tests produces the non-zero second derivative, the particular one of the corners K1 through K8 can be determined. However, if the corner is so obtuse that none of the four tests reveals a toggle, but the results of the four tests all indicate gradient values above the miinimum threshhold, then it is apparent that a corner of the K9 type must be present.

Figure 8:
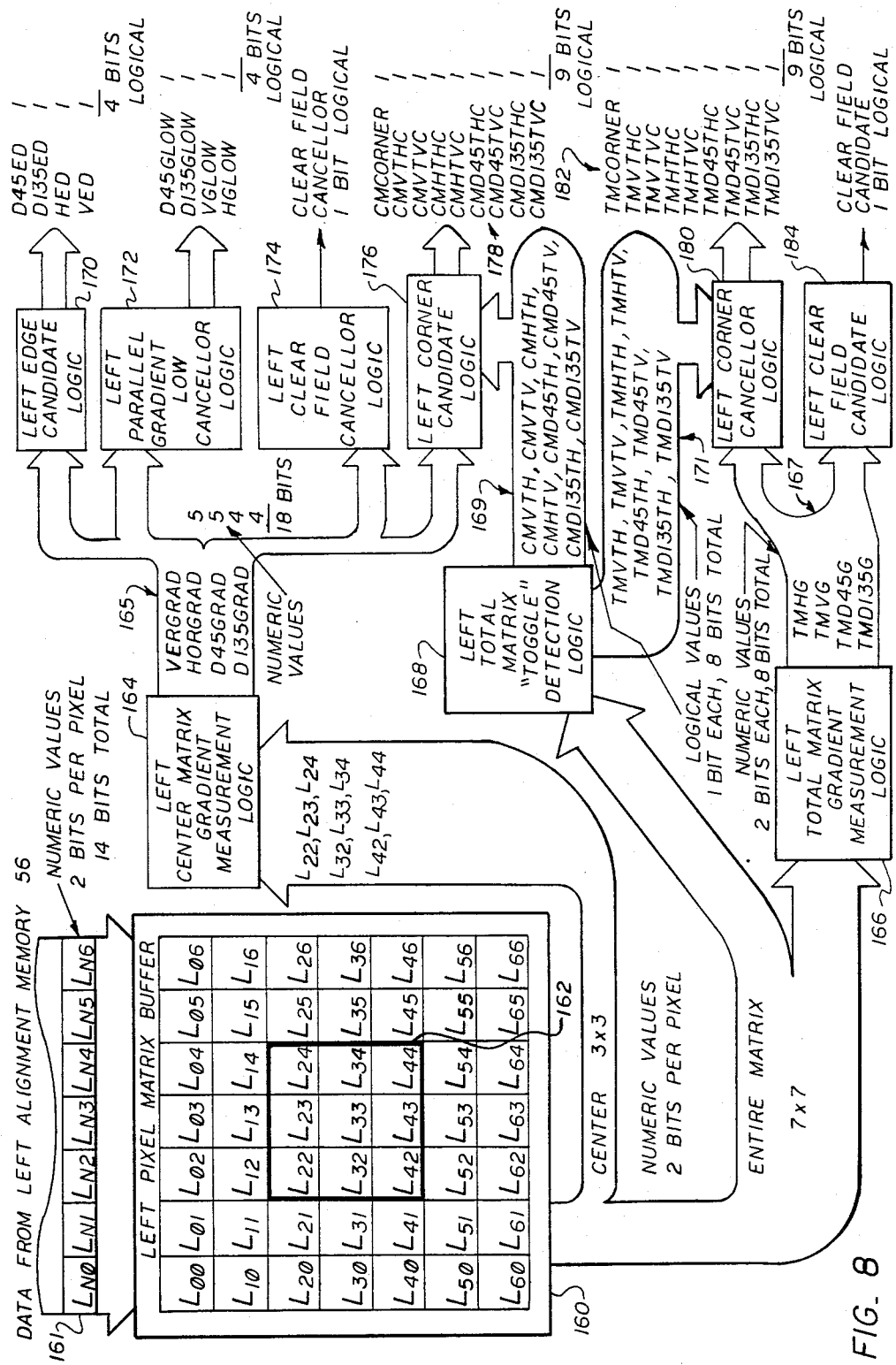
FIG. 8 is a block diagram schematically illustrating the function components of the detection and signal qualifying logic used in implementing the present invention.

Referring now to FIG. 8 of the drawing, the functional components of the left side detection logic 80, shown in FIG. 3, will be described in more detail, it being understood that the right side detection logic 82 is the mirror image of the illustrated circuit. Pixel data contained within memory 56 is read out and input to a left pixel matrix buffer 160 which at any point in time will contain pixel data in binary form corresponding to the 7×7 pixel array 95 illustrated in FIG. 3. Note that since the matrix is in effect moved vertically as indicated by the arrow 97, the last row of information into the buffer includes one pixel from the present scan of the pixels of the 420 pixel scan detector 31 together with one pixel from each of the last six detector scan. For convenience of discussion, each pixel is identified as $L_{n,m}$, where "n" is an integer indicating row position within the 7×7 matrix and "m" is an integer indicating column position.

At each pixel clock, the left pixel matrix buffer 160 receives from the left alignment memory 56 (FIG. 1), 14 bits of binary data representing seven horizontally adjacent pixels as illustrated at 161. On successive pixel clocks, vertically adjacent rows of pixels are delivered into buffer 160 for storage. The function of buffer 160 is to latch up the last seven such rows so as to present, in parallel, data corresponding to a seven pixel by seven pixel portion of the inspected image, such portion corresponding to the matrix 95 shown in FIG. 3.

Buffer 160 operates as a shift register with rows of pixels entering at the top and exiting at the bottom. This action, along with the action of the alignment memories, guarantees that for each pixel clock, a 7×7 matrix of data centered on a unique pixel will be presented to the subsequent circuitry. Thus, each and every pixel of the inspected image will eventually occupy the center of matrix position.

Data corresponding to the centermost sub-matrix 162 is coupled into a logic unit 164 which is designated the Left Center Matrix Gradient Measurement Logic unit and such logic processes the 18 binary bits corresponding to the nine pixels of the 3×3 center matrix 162 and produces four output signals corresponding to the component of gradient local to center measured along four vectors. The outputs thus generated correspond to the intensity profiles along vertical, horizontal, 45° and 135° slices through the 3×3 center matrix 162. The values output are calculated as follows:

Gradient Along +45° Line $$D45GRAD = \sum_{n=2}^{3} \sum_{m=2}^{3} |L_{n,m} - L_{n+1,m+1}|$$

Gradient Along +135° Line $$D135GRAD = \sum_{n=3}^{4} \sum_{m=2}^{3} |L_{n,m} - L_{n-1,m+1}|$$

Gradient Along Vertical Axis $$VERGRAD = \sum_{n=2}^{3} \sum_{m=2}^{4} |L_{n,m} - L_{n+1,m}|$$

Gradient Along Horizontal Axis $$HORGRAD = \sum_{n=2}^{4} \sum_{m=2}^{3} |L_{n,m} - L_{n,m+1}|$$

Since $\theta \leq |L_{n,m} - L_{p,q}| \leq 3$ for any n,m, p or q
D45GRAD≦12
D135GRAD≦12
VERGRAD≦18
HORGRAD≦18

For this reason, the center matrix diagonal gradient values must be 4 binary bits each in length and the center matrix vertical and horizontal gradient values must be 5 bits each in length. At each pixel clock, each of these four values is updated to reflect the instantaneous gradient near center of matrix for each new pixel at center.

The Left Total Matrix Gradient Measurement Logic unit 166 processes data from the entire 7×7 pixel matrix producing gradient values again measured along 4 vectors. The values thus generated and listed at 167 are much like the center matrix gradient values except that proximity to center of matrix is no longer important. The values output are calculated as follows:

Total Matrix Horizontal Gradient $$TMHG = \sum_{n=0}^{6} \sum_{M=0}^{5} |L_{n,m} - L_{n,m+1}|$$

Total Matrix Vertical Gradient $$TMVG = \sum_{n=0}^{5} \sum_{m=0}^{6} |L_{n,m} - L_{n+1,m}|$$

Total Matrix Diagonal 45° Gradient $$TMD45G = \sum_{n=0}^{5} \sum_{m=0}^{5} |L_{n,m} - L_{n+1,m+1}|$$

Total Matrix Diagonal 135° Gradient $$TMD135G = \sum_{n=1}^{6} \sum_{m=0}^{5} |L_{n,m} - L_{n-1,m+1}|$$

Although any one of these values may be quite large, the subsequent circuitry treats any value above 2 the same as it would treat a value of 2. Therefore, two binary bits per value is sufficient. These values are updated for each pixel clock.

The Left Total Matrix Toggle Detection Logic unit 168 processes data from the entire 7×7 matrix and generates outputs corresponding to the second derivative of pixel intensity as measured over a vectored three pixel interval. Two sets of outputs are generated; one set, listed at 169, pertains to vectored three pixel intervals containing L33, the center pixel of the total matrix as the center of the interval, the other set, listed at 171, pertains to all possible three pixel intervals contained within the 7×7 matrix. In both cases, each output signal corresponds to a change of at least one level from the first pixel of the interval to the second pixel of the interval, followed by a change of at least one level in the opposite direction between the second and third pixels of the interval. In each case, eight signals are generated corresponding to the four vectored directions and sense (positive or negative) of the second derivative. The states of these signals are determined as follows:

Total Matrix Vertical Toggle Hill $TMVTH = 1$   IFF   $L_{n-1,m} < L_{n,m} > L_{n+1,m}$
For some n,m: $1 \leq n \leq 5; 0 \leq m \leq 6$ Total Matrix Vertical Toggle Valley $TMVTV = 1$   IFF   $L_{n-1,m} > L_{n,m} < L_{n+1,m}$
For some n,m: $1 \leq n \leq 5; 0 \leq m \leq 6$ Total Matrix Horizontal Toggle Hill $TMHTH = 1$   IFF   $L_{n,m-1} < L_{n,m} > L_{n,m+1}$
For some n,m: $0 \leq n \leq 6; 1 \leq m \leq 5$ Total Matrix Horizontal Toggle Valley $TMHTV = 1$   IFF   $L_{n,m-1} > L_{n,m} < L_{n,m+1}$
For some n,m: $0 \leq n \leq 6; 1 \leq m \leq 5$ Total Matrix Diagonal 45° Toggle Hill $TMD45TH = 1$   IFF   $L_{n-1,m-1} < L_{n,m} > L_{n+1,m+1}$
For some n,m: $1 \leq n \leq 5; 1 \leq m \leq 5$ Total Matrix Diagonal 45° Toggle Valley $TMD45TV = 1$   IFF   $L_{n-1,m-1} > L_{n,m} < L_{n+1,m+1}$
For some n,m: $1 \leq n \leq 5; 1 \leq m \leq 5$ Total Matrix Diagonal 135° Toggle Hill $TMD135TH = 1$   IFF   $L_{n+1,m-1} < L_{n,m} > L_{n-1,m+1}$
For some n,m: $1 \leq n \leq 5; 1 \leq m \leq 5$ Total Matrix Diagonal 135° Toggle Valley

| | | | |
|---|---|---|---|
| $TMD135TV = 1$ | IFF | $L_{n+1,m-1} > L_{n,m} < L_{n-1,m+1}$ | |
| | For some n,m: $1 \leq n \leq 5; 1 \leq m \leq 5$ | | |
| Center Matrix Vertical Toggle Hill | | | |
| $CMVTH = 1$ | IFF | $L_{23} < L_{33} > L_{43}$ | |
| Center Matrix Vertical Toggle Valley | | | |
| $CMVTV = 1$ | IFF | $L_{23} > L_{33} < L_{43}$ | |
| Center Matrix Horizontal Toggle Hill | | | |
| $CMHTH = 1$ | IFF | $L_{32} < L_{33} > L_{34}$ | |
| Center Matrix Horizontal Toggle Valley | | | |
| $CMHTV = 1$ | IFF | $L_{32} > L_{33} < L_{34}$ | |
| Center Matrix Diagonal 45° Toggle Hill | | | |
| $CMD45TH = 1$ | IFF | $L_{22} < L_{33} > L_{44}$ | |
| Center Matrix Diagonal 45° Toggle Valley | | | |
| $CMD45TV = 1$ | IFF | $L_{22} > L_{33} < L_{44}$ | |
| Center Matrix Diagonal 135° Toggle Hill | | | |
| $CMD135TH = 1$ | IFF | $L_{42} < L_{33} > L_{24}$ | |

Center Matrix Diagonal 135° Toggle Valley $CMD135TV = 1$   IFF   $L_{42} > L_{33} < L_{24}$ The Left Edge Candidate Logic unit 170 operates on the four center matrix gradient values output at 165 from unit 164 and produces the Left Edge CANDIDATE signals D45ED, D135ED, HED and VED. Each of the four edge candidate signals corresponds to and indicates the detection of an edge along one of the four gradient vector directions. A given edge candidate signal is active if the center matrix gradient measure perpendicular to the implied direction is strong and the center matrix gradient measured parallel to the implied direction is weak. The states of these signals are determined as follows:

| | | |
|---|---|---|
| Diagonal 45° Edge | | |
| $D45ED = 1$   IFF | D135GRAD > 6 AND D45GRAD < 3 | |
| Diagonal 135° Edge | | |
| $D135ED = 1$   IFF | D45GRAD > 6 AND D135GRAD < 3 | |
| Horizontal Edge | | |
| $HED = 1$   IFF | VERGRAD > 6 AND HORGRAD < 3 | |
| Vertical Edge | | |
| $VED = 1$   IFF | HORGRAD > 6 AND VERGRAD < 3 | |

The Left Parallel Gradient Low Cancellor Logic unit also operates on the four vlaues output at 165 and 172 produces the center matrix gradient values DG45LOW, D135GLOW, VGLOW, and HGLOW. Each of the four cancellor signals corresponds to one of the four gradient vector directions. A given "gradient low" cancellor signal is active if the center matrix gradient parallel to the implied direction is weak. The states of these signals are determined as follows:

| | | |
|---|---|---|
| Diagonal 45° Gradient Low | | |
| $D45GLOW = 1$ | IFF | D45GRAD < 3 |
| Diagonal 135° Gradient Low | | |
| $D135GLOW = 1$ | IFF | D135GRAD < 3 |
| Vertical Gradient Low | | |
| $VGLOW = 1$ | IFF | VERGRAD < 3 |
| Horizontal Gradient Low | | |

| | | | |
|---|---|---|---|
| HGLOW = 1 | 1FF | HORGRAD < 3 | |

The Left Clear Field Cancellor Logic unit 174 processes the same four center matrix gradient values and produces the CLEAR FIELD CANCELLOR signal. This signal indicates the absence of any edges within the center 3×3 matrix. The state of this signal is determined as follows:

| Clear Field Cancellor = 1 | |
|---|---|
| 1FF | VERGRAD < 2 |
| | AND HORGRAD < 2 |
| | AND D45GRAD < 2 |
| | AND D135GRAD < 2 |

Left Corner Candidate logic 176 processes the center matrix gradient values (165) along with the center matrix outputs 169 of the Toggle Detection Logic 168 and produces the CORNER CANDIDATE signals listed at 178. One of these signals, CMCORNER, is active any time a corner is sensed within the center matrix, including obtuse corners or softly quantized corners. The other signals are active only if CMCORNER is active and a toggle of the implied direction and sense is detected at center. These signals serve to define the orientation of acute or right angled corners. The state of these signals are determined as follows:

| Center Matrix Corner | | | |
|---|---|---|---|
| CMCORNER = 1 | 1FF | HORGRAD ≧ 4 | |
| | | AND VERGRAD ≧ 4 | |
| | | AND D45GRAD ≧ 4 | |
| | | AND D135GRAD ≧ 4 | |
| Center Matrix Vertical Toggle Hill Corner | | | |
| CMVTHC = 1 | 1FF | CMCORNER = 1 AND CMVTH = 1 | |

The remaining seven signals are simularly generated.

Left Corner Cancellor Logic unit 180 processes the total matrix gradient values 171 along with the total matrix outputs 167 of the Toggle Detection Logic 168 and produces the CORNER CANCELLOR signals listed at 182. One of these signals, TMCORNER, is active any time a corner is sensed within the 7×7 total matrix including obtuse and softly quantized corners. The other signals are active only if TMCORNER is active and a toggle of the implied direction and sense is detected somewhere within the total matrix. These signals serve to define the orientation of all acute or right angled corners within the total matrix. The states of these signals are determined as follows:

| Total Matrix Corner | | | |
|---|---|---|---|
| TMCORNER = 1 | 1FF | | TMHG > 2 |
| | | AND | TMVG > 2 |
| | | AND | TMD45G > 2 |
| | | AND | TMD135G > 2 |
| Total Matrix Vertical Toggle Hill Corner | | | |
| TMVTHC = 1 | 1FF | TMCORNER = 1 AND TMVTH = 1 | |

The remaining seven signals are simularly generated.

The Left Clear Field Candidate Logic unit 184 processes the total matrix canidate values indicated at 167 and produces the CLEAR FIELD CANDIDATE signal. This signal indicates the absence of edges within the 7×7 total matrix. The state of this signal is determined as follows:

| Clear Field Candidate = 1 | 1FF | | TMHG < 2 |
|---|---|---|---|
| | | AND | TMVG < 2 |
| | | AND | TMD45G < 2 |
| | | AND | TMD135G < 2 |

As indicated above, the Right Side Detection Logic 82 is the mirror image of the Left Side Detection Logic 80 illustrated in FIG. 8, and for simplicity is not repeated herein.

Figure 9:
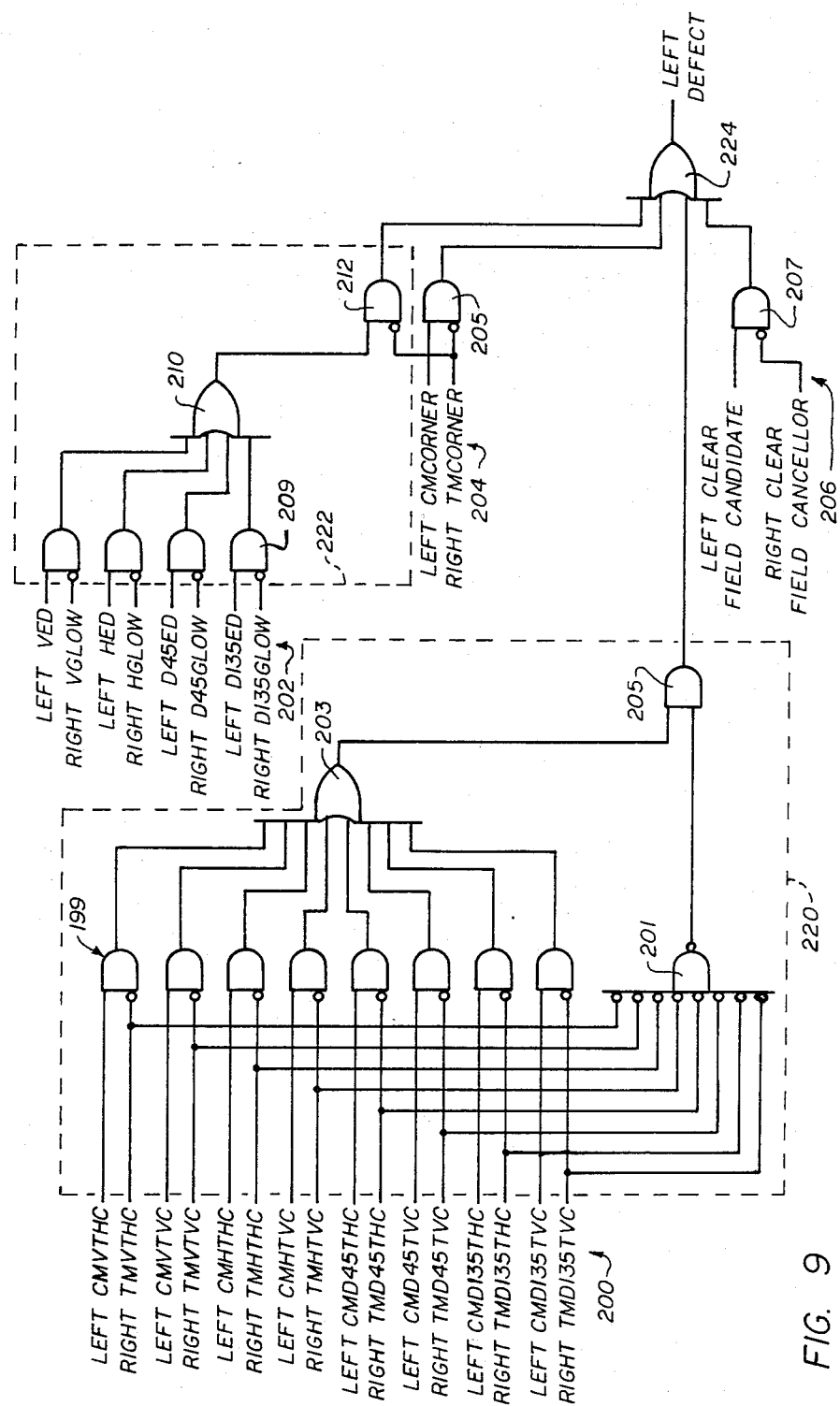
FIG. 9 is a logic diagram illustrating combinational logic used to process the signals developed by the logic shown in FIG. 8 of the drawing.

Referring now to FIG. 9 of the drawing, the principal functional components of the Combinational Logic 84 are illustrated in schematic detail.

This diagram illustrates the logic contained with the unit 108 as representatively shown in FIG. 3. As indicated, it receives left candidate and right cancellor information at four sets of inputs 200, 202, 204 and 206. It should perhaps here be pointed out that the logic generally represented at 106 in FIG. 3 is a mirror image of the FIG. 9 diagram and receives right candidate and left cancellor information from the detection logic units 80 and 82. In general, this circuitry basically looks for the presence of a candidate and the absence of a cancellor in order to indicate a defect. But there are a couple variations. It is always true that if a left center matrix corner is indicated as a candidate, a right total matrix corner must appear as a cancellor. If that does not occur, a defect will be indicated by the general corner detections gate 205 no matter what other signals exist. The same is true in the clear field case, e.g., if a left clear field candidate signal is generated and no right clear field cancellor signal appears, a defect will be indicated by clear field gate 207. However, the other two sources of defect are conditional upon other factors. As suggested above, detection of a corner alone indicates the presence of a corner and that is going to occur whether the corner is acute or obtuse, or softly quantized, or crisply quantized. But the additional descriptors by logic units 176 and 180 require an appreciable second derivative over three pixels and not every corner is going to cause such signal to be generated. For example, if a corner is too obtuse or too softly quantized, even if it is the appropriate orientation of corner, it still may not be indicated by one of the descriptor signals. For that reason, the candidates and cancellors of these toggle descriptors are checked by the specific corner sensing or detecting logic illustrated by the AND gates 199 and the active low AND gate 201. These gates combine with an OR gate 203 and an additional AND gate 205 to determine that if the right side, for instance, shows any descriptor at all, it must be the correct descriptor. But if it shows no descriptor at all, it is ignored. So if a descriptor is attached to a corner, it must be the correct one. If no descriptor is attached, then this sub-circuit is defeated.

The other type of defect signal tht is conditional is the type indicated by the edge and gradient low checks, i.e., the tests performed by the logic units 170 and 172 (FIG. 8). These tests are completed by the AND gates 209, OR gate 210 and AND gate 212. If one side indicates the presence of a vertical edge, it is normally expected that the other side will indicate a vertical gradient low. But, if the other side has a corner in the matrix, as perhaps caused by an alignment error, it is not appropriate to test for a low parallel gradient because the matrix may be approaching that corner and the parallel gradient may be becoming non-zero, with the result being that the corner cancellor gates out the edge defect if it is present. So that are really four sources of defect signal; the one with the toggle related function is referred to as the Specific Corner Sense Logic shown in FIG. 9 at 220, the one with the edge and gradient low related function is referred to as the Edge Defect Logic shown at 222, the one that just determines the presence of a corner is referred to as the General Corner Defect Logic shown at 205, and the fourth one is referred to as the Clear Field Detect Logic shown at 207. The latter two are the only ones that are always enabled, the other two are conditional.

Each of the outputs of the four sources of defect signal are ORed together through an OR gate 224 to produce a single "Left Defect" signal, or in the case of the right side circuit (not shown), a "Right Defect" signal. Thus, as indicated in FIG. 3, the Left and Right Defect signals are ORed together by OR gate 110 to provide a single "Defect" signal at 85.

Although the present invention has been described above in terms of a schematically illustrated version of a preferred embodiment, it is to be understood that such embodiment is given by way of example and is not intended to be limiting in any way. For example, other levels of data than those described could just as well be processed. It is therefore intended that the appended claims be interpreted as covering all alterations and modifications as fall within the true spirit and scope of the invention.

What is claim is:

1. A method for detecting defects in a reticle, metal mask or another object such as a photomask having a plurality of duplicate two dimensional image patterns, for using in comparing two like patterns and indicating defects wherever the patterns do not match, said method comprising the steps of:

forming a first representation of a first of said patterns; forming a second representation of the second of said patterns for comparison to said first representation, each of said representations being composed of a two dimensional array of uniformally spaced apart pixels having relative positions that correspond to particular positions on the object being inspected, each said pixel having a value that indicates the absence or presence of pattern image at the particular position represented by that pixel;

forming a first matrix of a group of n×m adjacent pixels of said first representation;

forming a second matrix of a group of n×m adjacent pixels of said second representation, where n and m are integers;

inspecting differences between adjacent pixels of said first matrix and providing first gradient and toggle information indicative of certain characteristics of a first portion of said first pattern represented thereby and providing second gradient and toggle information indicative of certain characteristics of a first subportion of said first portion of said first pattern;

inspecting differences between adjacent pixels of said second matrix and providing third gradient and toggle information indicative of certain characteristics of a second portion of said second pattern represented thereby and fourth gradient and toggle information indicative of certain characteristics of a second subportion of said second portion of said second pattern;

combining said first and fourth gradient and toggle information to develop a first defect signal indicative of any defect appearing at a particular position in said second pattern; and combining said second and third gradient and toggle information to develop a second defect signal indicative of any defect appearing at a particular position in said second pattern.

2. A method for detecting defects as recited in claim 1 and further comprising combining said first and second defect signals to provide an output signal indicative of the presence of a defect at a particular position in either said first pattern or said second pattern.

3. A method for detecting defects as recited in claim 2 wherein said first portion of said first pattern corresponds to said first matrix and wherein said first subportion corresponds to a submatrix of a group of r×s adjacent pixels, where r and s are integers smaller than n and m, respectively, and wherein the centermost pixel of said first submatrix is also the centermost pixel of said first matrix.

4. A method for detecting defects as recited in claim 3 wherein said second subportion corresponds to a submatrix of a group if r×s adjacent pixels, where r and s are integers smaller than n and m, respectively, and wherein the centermost pixel of said second submatrix is also the centermost pixel of said second matrix.

5. A method for detecting defects as recited in claim 4 wherein the gradient portion of said first and second gradient and toggle information is obtained by summing the absolute values of the differences between adjacent pixels taken along vectors in the horizontal, vertical, 45° relative to vertical and 135° relative to vertical directions.

6. A method for detecting defects as recited in claim 5 wherein the toggle portion of said first and second gradient and toggle information is obtained by detecting at least two changes of value in opposite directions in chains of pixels aligned along said vertical, horizontal, 45° from vertical, and 135° from vertical directions.

7. A method for detecting defects as recited in claim 6 wherein the characteristics of said first and second subportions represented by said second and third gradient and toggle information include the presence of an edge along any of said vectors, the existence of a low value gradient along any of said vectors, the existence of a clear field within the corresponding subportion, and the existence of a corner within the corresponding subportion.

8. A method for detecting defects as recited in claim 7 wherein said characteristics represented by said second and third gradient and toggle information further includes an identification of the type of any corner detached within the corresponding subportion.

9. A method for detecting defects as recited in claim 8 wherein the characteristics of said first and second portions represented by said first and fourth gradient and toggle information include the existence of a corner detected within the corresponding portion, the type of corner detected within the corresponding portion, and the existence of a clear field within the corresponding portion.

10. A method for detecting defects as recited in claim 9 wherein the said combining of said first and fourth gradient and toggle information includes indicating a defect in said second pattern if said fourth gradient and toggle information indicates the presence of a corner and said first gradient and toggle information does not indicate the presence of a corner.

11. A method for detecting defects as recited in claim 10 wherein the said combining of said first and fourth gradient and toggle information further includes indicating a defect in said second pattern if said fourth gradient and toggle information indicates a clear field and said first gradient and toggle information does not indicate a clear field.

12. A method for detecting defects as recited in claim 11 wherein said first and fourth gradient and toggle information further includes indicating a defect in said second pattern if said fourth gradient and toggle information indicates in edge and said first gradient and toggle information does not indicate an edge and said first gradient and toggle information does not indicate a corner.

13. A method for detecting defects as recited in claim 12 wherein said first and fourth gradient and toggle information further includes indicating a defect in said second pattern if said fourth gradient and toggle information indicates a particular type of corner and said first gradient and toggle information does not indicate said particular type of corner and said first gradient and toggle information does indicate the presence of some other type of corner.

14. Apparatus for detecting defects in a reticle, metal mask or another object such as a photomask having a plurality of duplicate two dimensional image patterns thereon by comparing information corresponding to two like patterns and indicating defects whenever the two sets of information do not match, comprising:
  scanning means for scanning an object having a first pattern thereon and for developing first electrical signals having values corresponding to the image content of first pixel area portions of the said pattern;
  means for developing second electrical signals corresponding to the image content of second pixel area portions of a reference pattern corresponding to said first pattern;
  first detection means for inspecting a first group of said first signals corresponding to a first $n \times m$ matrix of said first pixel area portions and for developing first candidate signals and first cancellor signals;
  second detection means for inspecting a second group of said second signals corresponding to a second $n \times m$ matrix of said second pixels and for developing said candidate signals and second cancellor signals;
  combinational logic means for combining said first candidate signals and said second cancellor signals to develop a first defect signal indicative of a defect appearing in the portion of said pattern corresponding to said first matrix, and for combining said second candidate signals and said first cancellor signal to develop a second defect signal indicative of a defect appearing in the portion of said pattern corresponding to said second matrix.

15. Apparatus for detecting defects as recited in claim 14 and further comprising means for combining said first and second defect signals to provide an output signal indicative of the presence of a defect at a particular position in either said first pattern or said second pattern.

16. Apparatus for detecting defects as recited in claim 15 wherein said first detection means includes first gradient measurement logic for inspecting a second group of said first signals corresponding to a first $r \times s$ center matrix of said first pixels where r and s are integers smaller than n and m respectively, and wherein the centermost pixel of said first center matrix is also the centermost pixel of said first matrix, and for developing first center matrix gradient signals corresponding thereto by summing the absolute values of the differences between signals corresponding to adjacent pixels in said first center matrix taken along vectors in the horizontal, vertical, 45° relative to vertical, and 135° relative to vertical directions.

17. Apparatus for detecting defects as recited in claim 16 wherein siad first detection means further includes first toggle detection logic for inspecting said first signals and for detecting at least two changes of value in opposite directions of signals corresponding to chains of contiguous pixels aligned along said vertical, horizontal, 45° and 135° directions, and for developing first toggle signals commensurate therewith.

18. Apparatus for detecting defects as recited in claim 17 wherein said first detection means further includes second gradient measurement logic for inspecting said first signals and for developing first total matrix gradient signals corresponding thereto by summing the absolute values of the differences between signals corresponding to adjacent pixels in said first matrix taken along vectors in said horizontal, vertical, 45° and 135° directions.

19. Apparatus for detecting defects as recited in claim 18 wherein said first detection means further includes first detecting logic responsive to said first center matrix gradient signals and to said first toggle signals and operative to develop first edge candidate signals commensurate with the presence of an edge along any of said vectors, first signal low cancellor signals commensurate with the existence of a low value gradient along any of said vectors, first clear field cancellor signals commensurate with the existence of a clear field within said submatrix, and first corner candidate signals commensurate with the existence of a corner within said center matrix.

20. Apparatus for detecting defects as recited in claim 19 wherein said first detection means further includes second detecting logic responsive to said first toggle signals and said first total matrix gradient signals and operative to develop first total matrix corner cancellor signals and first clear field candidate signals.

21. Apparatus for detecting defects as recited in claim 20 wherein said second detection means includes third gradient measurement logic for inspecting a second group of said second signals corresponding to a second $r \times s$ center matrix of said second pixels where r and s are integers smaller than n and m respectively, and wherein the centermost pixel of said second center matrix is also the centermost pixel of said second matrix, and for developing second center matrix gradient signals corresponding thereto by summing the absolute values of the differences between signals corresponding to adjacent pixels in said second center matrix taken along vectors in the horizontal, vertical, 45° relative to vertical, and 135° relative to vertical directions.

22. Apparatus for detecting defects as recited in claim 21 wherein siad second detection means further includes second toggle detection logic for inspecting said second signals and for detecting at least two changes of value in opposite directions of signals corresponding to chains of contiguous pixels aligned along said vertical, horizontal, 45° and 135° directions, and for developing second toggle signals commensurate therewith.

23. Apparatus for detecting defects as recited in claim 22 wherein said second detection means further includes fourth gradient measurement logic for inspecting said second signals and for developing second total matrix gradient signals corresponding thereto by summing the absolute values of the differences between signals corresponding to adjacent pixels in said second matrix taken along vectors in said horizontal, vertical, 45° and 135° directions.

24. Apparatus for detecting defects as recited in claim 23 wherein said second detection means further includes third detecting logic responsive to said second center matrix gradient signals and to said second toggle signals and operative to develop second edge candidate signals commensurate with the presence of an edge along any of said vectors, second signal low cancellor signals commensurate with the existence of a low value gradient along any of said vectors, second clear field cancellor signals commensurate with the existence of a clear field within said submatrix, and second corner candidate signals commensurate with the existence of a corner within said center matrix.

25. Apparatus for detecting defects as recited in claim 24 wherein said second detection means further includes fourth detecting logic responsive to said second toggle signals and said second total matrix gradient signals and operative to develop second total matrix corner cancellor signals and second clear field candidate signals.

* * * * *